(12) United States Patent
Lejon

(10) Patent No.: US 8,040,185 B2
(45) Date of Patent: Oct. 18, 2011

(54) AMPLIFYING DEVICE

(75) Inventor: Thomas Lejon, Vallentuna (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 12/666,392

(22) PCT Filed: Jul. 5, 2007

(86) PCT No.: PCT/SE2007/050497
§ 371 (c)(1),
(2), (4) Date: Dec. 23, 2009

(87) PCT Pub. No.: WO2009/005430
PCT Pub. Date: Jan. 8, 2009

(65) Prior Publication Data
US 2010/0194480 A1    Aug. 5, 2010

(51) Int. Cl.
*H03F 3/18* (2006.01)
(52) U.S. Cl. ........................ 330/251; 330/306
(58) Field of Classification Search .......... 330/251–261, 330/306, 207 A, 10
See application file for complete search history.

(56) References Cited

U.S. PATENT DOCUMENTS

| 7,705,674 B2 * | 4/2010 | McMorrow | 330/251 |
| 2002/0101284 A1 | 8/2002 | Kee et al. | |

FOREIGN PATENT DOCUMENTS

JP    7170132 A    7/1995

OTHER PUBLICATIONS

Long, A., "High Frequency Current Mode Class-D Amplifiers With High Output Power and Efficiency", Dept. of Electrical and Computer Engineering, University of California, Santa Barbara, May 2003, Retrieved from the Internet: http://www.ece.ucsb.edu/rad.pubs/master/along_2003.pdf>, 50 pages.

(Continued)

*Primary Examiner* — Hieu Nguyen
(74) *Attorney, Agent, or Firm* — Rothwell, Figg, Ernst & Manbeck, P.C.

(57) ABSTRACT

The present invention concerns an amplifying device arranged to receive an input signal having a certain duty cycle. The amplifying device comprise a first switching unit having an input terminal adapted to receive a first half of the input signal, and an output terminal adapted to be connected to a first signal output where a first half of an output signal is provided. The amplifying device comprise a second switching unit having an input terminal adapted to receive a second half of the input signal and an output terminal adapted to be connected to a second signal output where a second half of the output signal is provided. Also, the first switching unit and the second switching units are adapted to receive an input signal, wherein the first half of said input signal has the same duty cycle as the second half of the input signal but shifted in phase. The present invention also concerns a wireless transceiver and a radio transmission device.

13 Claims, 6 Drawing Sheets

OTHER PUBLICATIONS

Hung, T-P et al., "Design of High-Efficiency Current-Mode Class-D Amplifiers for Wireless Handsets", IEEE Transactions on Microwave Theory and Techniques, vol. 53, Jan. 1, 2005, XP11125360A, pp. 144-150.

Hung, T-P et al., "High Efficiency Current-Mode Class-D Amplifier with Integrated Resonator" XP10728155A, Microwave Symposium Digest, 2004 IEEE MTT-S International, Fort Worth, TX, USA, Jun. 6, 2004, Conference Proceedings Article, pp. 2035-2038.

Long, A., et al., "A 13W Current Mode Class D High Efficiency 1 GHz Power Amplifier", XP010635142A, Midwest Symposium on Circuits and Systems, New York, NY, IEEE, US, Aug. 4, 2002, 7731156 INSPEC, vol. 1 of 3, Conference proceedings, 4 pages.

Official Action issued on Jul. 7, 2011 in corresponding European Patent Application No. 07 769 043.6, 4 pages.

* cited by examiner

AMPLIFYING DEVICE

CROSS-REFERENCE TO RELATED APPLICATION

This application is a 35 U.S.C. §371 National Phase Application from PCT/SE2007/050497, filed Jul. 5, 2007, and designating the United States.

TECHNICAL FIELD

The present invention relates to the field of amplifiers. More particularly the present invention relates to an amplifying device as well as a wireless transceiver and a radio transmission device comprising such an amplifying device.

BACKGROUND

The rapid development of the telecommunications industry have made wireless handheld devices like cell phones, pagers, two-way messaging devices, etc. massively popular, creating a need for new electronic components and circuits in both mobile and base station systems as competition drives the introduction of expanded capabilities.

Radio frequency power amplifiers contribute to the power consumption in the communications systems. To extend battery life in mobile units, and to reduce operating costs of base stations, there is a need to develop new amplifiers to replace the traditionally inefficient, power wasting, elderly designs currently in use.

Many contemporary base station amplifiers employ complex techniques to realize amplifiers with a high degree of linearity over a broad frequency range. Unfortunately those solutions have a low efficiency.

Handset power amplifiers also suffer from efficiency problems, often more critical than those for base stations as the power supply for mobile user equipment is strictly limited. Today's smaller, faster and more effective portable electronics demand high power with only little losses.

For many decades, linear power amplifiers of the Class A and/or Class AB type have been employed as radio frequency power amplifiers for cellular base station systems. These amplifiers are based on the operation of a transistor in its linear mode. As such, they are however limited in their ability to efficiently amplify radio frequency signals.

The Doherty amplifier is another common method to increase the efficiency in the context of power amplification. However, the Doherty method is often demanding to implement. In practical cases a Doherty amplifier seldom reaches an efficiency level above 50%.

Switching mode amplifiers have been used for quite some time in various electronic systems including audio power amplifiers and switching power supply circuits. In switching mode amplifiers, the transistor is operated as a switch. Switching mode amplifiers suffer however from the existence of some fundamental limits, such as large parasitic capacitance, which may prevent many transistors from working well at high power and frequency.

The Class-D amplifier architecture has often been used in low frequency and audio frequency applications. The traditional Class D amplifier, or Voltage Mode Class D amplifier, is defined as a switching circuit that results in the generation of a half-sinusoidal current waveform and a square voltage waveform. Voltage Mode Class D amplifiers are however afflicted with a number of problems that make them awkward to realize. Firstly, the availability of suitable devices for the upper switch is limited. Secondly, device parasitics such as drain-source capacitance and lead inductance result in losses in each cycle.

The Current Mode Class D amplifiers that has emerged, has proven to be feasible to implement also at high frequencies and have output levels with good bandwidth and peak drain efficiency. However, it is very important to optimize the harmonic terminations in the output filter to get the square current wave form and the half wave sinusoidal voltage waveform to minimize overlaps. Nearly ideal waveforms are critical to maximizing efficiency, as an overlap of the current and voltage waveforms correspond to power dissipated in the switch and cause rapid efficiency degradation.

Thus there is a problem to develop a Current Mode Class D amplifier with harmonic terminations in the output filter to get the square current wave form and the half wave sinusoidal voltage waveform to minimize overlaps, in order to reach a high degree of efficiency.

Amplitude modulation is a technique used in electronic communication, most commonly for transmitting information via a radio carrier wave. Amplitude modulation works by varying the strength of the transmitted signal in relation to the information being sent. For example, changes in the signal strength can be used to reflect the sounds to be reproduced by a speaker. Unfortunately, Current Mode Class D amplifiers loose efficiency when working in back off i.e. working below full effect, why they at present are unsuitable to be used for amplitude modulation of a radio signal. Thus there is a problem with efficiency in back off.

Another problem with Current Mode Class D amplifiers is that they occasionally may suffer from the occurrence of large voltage spikes when symmetrically pulse width modulated. This prevents practical usage since the switching units can break because of the large voltage spikes.

SUMMARY

The present invention aims at obviating or reducing at least some of the above mentioned disadvantages associated with existing technology.

It is an object of the present invention to provide an amplifier with an improved degree of efficiency.

The object is achieved by an amplifying device arranged to receive an input signal having a certain duty cycle. The amplifying device comprise a first switching unit having an input terminal adapted to receive a first half of the input signal, and an output terminal adapted to be connected to a first signal output where a first half of an output signal is provided.

The amplifying device comprise a second switching unit having an input terminal adapted to receive a second half of the input signal and an output terminal adapted to be connected to a second signal output where a second half of the output signal is provided.

Also, the first switching unit and the second switching unit are adapted to receive an input signal, wherein the first half of said input signal has the same duty cycle as the second half of the input signal but shifted in phase.

The amplifying device may with advantage be provided in a wireless transceiver as well as in a radio transmission device such as a wireless access point or a wireless terminal.

An advantage of the present device is that an improved efficiency is reached, which saves energy resources.

BRIEF DESCRIPTION OF THE DRAWINGS

The present invention will now be described more in detail in relation to the enclosed drawings, in which.

DETAILED DESCRIPTION

The invention is defined as an amplifying device which may be put into practice in the embodiments further described below.

Figure 1A:
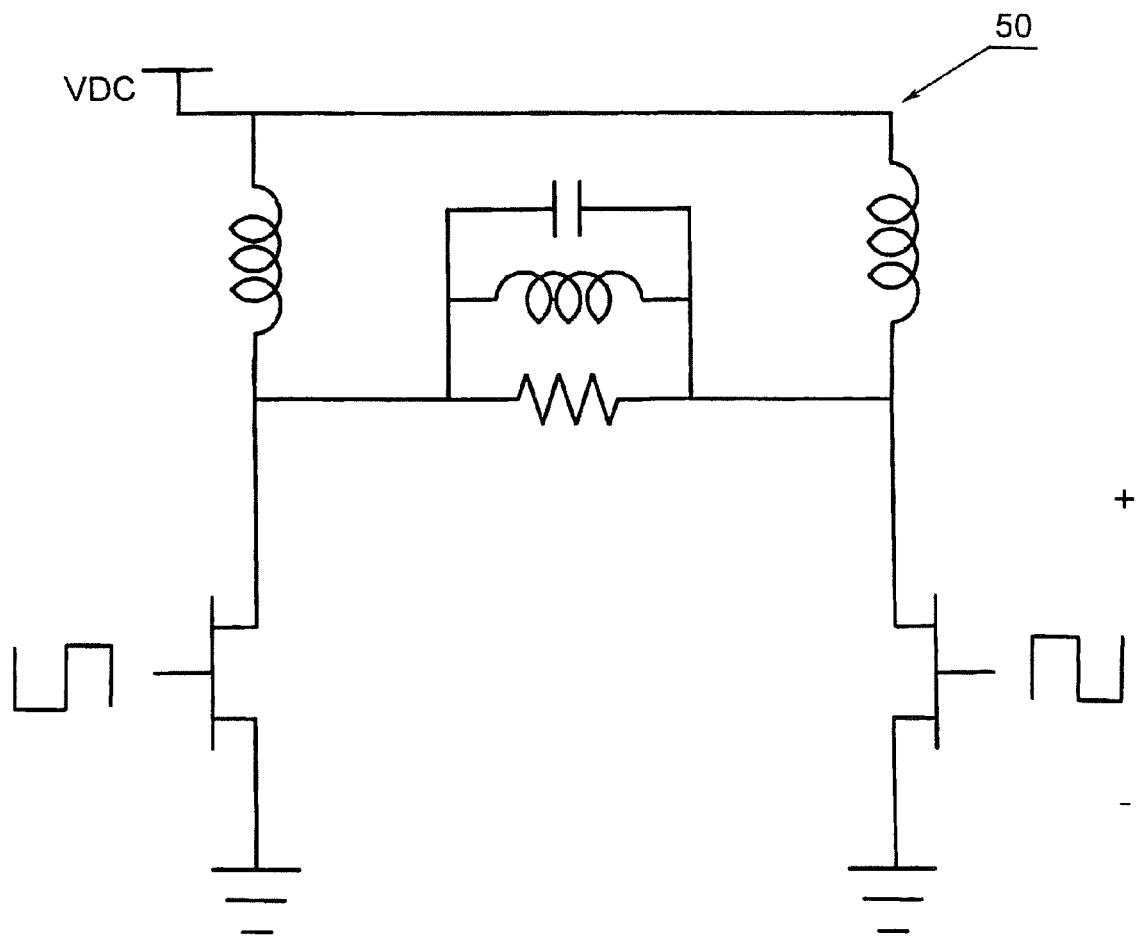
FIG. 1A is a schematic illustration over a Current Mode Class D amplifier according to existing technology.

FIG. 1A depicts a Current Mode Class D amplifier 50 according to existing technology, suffering from inter alia at least some of the previously discussed problems.

Figure 1B:
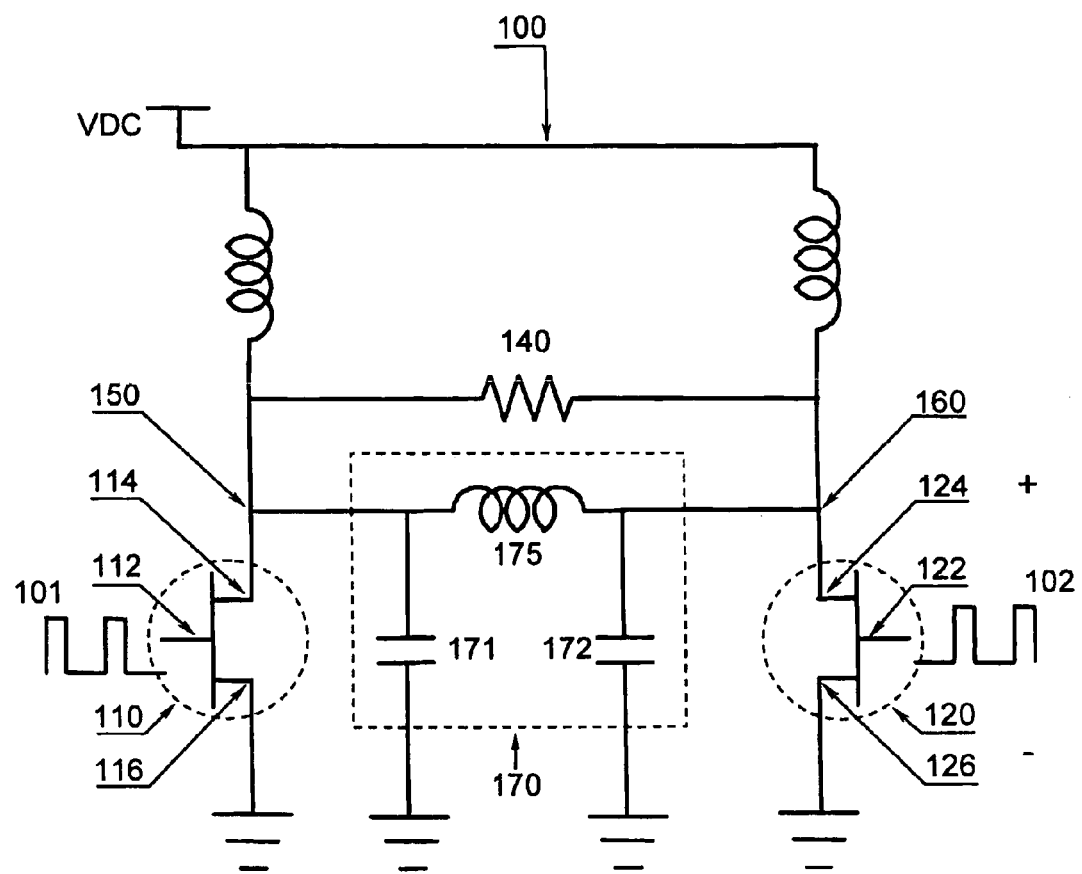
FIG. 1B is a schematic illustration over an amplifying device according to the present invention.

FIG. 1B illustrates an amplifying device 100 according to the present invention. The amplifying device 100 is arranged to receive an input signal 200 having a certain duty cycle. The duty cycle is the proportion of time during which the amplifying device 100 is operated. For example, in an ideal pulse train, having rectangular pulses, the duty cycle is the pulse duration divided by the pulse period. For a pulse train in which the pulse duration is 1 µs and the pulse period is 4 µs, the duty cycle is 0.25, i.e. ¼. The duty cycle of a square wave is 0.5, or ½.

The amplifying device 100 according to the present invention may in one embodiment be realised by means of a Current Mode Class D amplifier. However, the invented amplifying device 100 may be embodied also by means of other types of amplifiers, e.g. Transformer-coupled current-mode class-D amplifiers.

The amplifying device 100 according to the present invention may in an embodiment be adapted to receive a pulse width modulated input signal 200. However, the present amplifying device 100 may also be adapted to receive any other kind of input signal 200.

The amplifying device 100 comprises two switching units 110 and 120. The switching units 110 and 120 may be embodied by any type of switches or transistors, such as Insulated Gate Bipolar Transistor (IGBT), Metal-Oxide-Semiconductor Field-Effect Transistor (MOSFET), junction gate field-effect transistor (JFET), field-effect transistor FET, LDMOS transistors, GaAs transistors, GaAs MESFET, Gallium-Nitride High Electron Mobility Transistor (GaN-HEMT), valves or PNP-transistors etc. In fact, the switching units 110 and 120 may even be embodied by different type of switches or transistors, such that e.g. the first switching unit 110 may be embodied by a switch and the second switching unit 120 may be embodied by a transistor.

However, in order to facilitate the less initiated reader's comprehension process, and for the sole purpose of illustration, an embodiment wherein the switching units 110 and 120 are realised by means of two MOSFET transistors will now be described more in detail.

The first switching unit 110 may have an input terminal 112 adapted to receive a first half 101 of the input signal 200, and an output terminal 114 adapted to be connected to a first signal output 150 where a first half of an output signal is provided. The term input terminal is here intended to cover equivalent terms, such as gate or base.

The input terminal 112 may be thought of as controlling the opening and closing of a physical gate. This gate permits electrons to flow through or blocks their passage by creating or eliminating a channel between the source terminal 116 and the output terminal 114. Electrons flow from the source terminal 116 towards the output terminal 114 if influenced by an applied voltage (VDC). The term output terminal is here intended to cover equivalent terms, such as drain or collector.

The amplifying device 100 also comprises a second switching unit 120 having an input terminal 122 adapted to receive a second half 102 of the input signal 200 and an output terminal 124 adapted to be connected to a second signal output 160 where a second half of the output signal is provided.

Further, according to the present amplifying device 100, the first switching unit 110 and the second switching unit 120 are adapted to receive an input signal 200, wherein the first half 101 of said input signal 200 has the same duty cycle as the second half 102 of the input signal 200 but shifted in phase.

By changing the drive wave form to a signal such that the duty cycle is equal on each switching unit 110 and 120 but different in time, the efficiency in back off may be improved. This may be an advantage in particular when using a Current Mode Class D amplifier.

Efficiency in back off denotes efficiency when an amplifier 100 is used below its maximum available output power. Back off is the difference in decibels between actual used output power and the maximum available output power of the amplifier 100.

By letting the first half 101 of the input signal 200 have the same duty cycle as the second half 102 of the input signal 200, but shifted in phase, the current in the amplifier 100 may be reduced when the output power in the load 140 is changed by the duty cycle. In one preferred embodiment of the present device, the phase of the first half 101 of the input signal 200 is shifted 180 degrees to the second half 102 of the input signal 200. The situation with 180 degrees phase shift between the two halves 101 and 102 of he input signal 200 may be referred to as a symmetric signal. Thereby the sum of the DC components of the currents passing the switching units 110 and 120 may be reduced as the power is reduced, which leads to an improved efficiency compared with previously presented solution 50, especially when working in back off. This is an advantage in particular when using a Current Mode Class D amplifier.

Thus, according to one embodiment of the present amplifying device, the input signal 200 is a symmetric input signal, such that the first half 101 of said input signal 200 has the same duty cycle as the second half 102 of the input signal 200 but shifted 180 degrees in phase.

The present amplifying device 100 is however by no means limited to be used with a 180 degrees phase shift, between the two halves 101 and 102 of the input signal 200. They may as well be phase shifted in an arbitrary angle between 0 and 360 degrees.

The amplifying device 100 may comprise a group of reactive elements 170 such as capacitors or inductors, e.g. in the outward appearance of an output filter. The group of reactive elements 170 may be connected to the output terminal 114 of the first switching unit 110 and to the output terminal 124 of the second switching unit 120. The group of reactive elements 170 may comprise at least one inductor 175 and at least one capacitor 171, 172, in which as a minimum one of the said inductor 175 or capacitor 171, 172 is connected to a ground node. Thereby voltage spikes in the amplifying device 100 may be avoided.

The group of reactive elements 170 in the amplifying device 100 may however in one embodiment consist of at least two reactive elements of the same kind 171 and 172, connected to a ground node, e.g. at least two capacitors 171 and 172 and at least one inductor 175.

However, in another embodiment, the group of reactive elements 170 may comprise at least two inductors 175 connected to a ground node and at least one capacitor 171 and 172.

In an embodiment of the invention, the group of reactive elements 170 comprise one inductor 175 and two capacitors 171 and 172, wherein the two capacitors 171 and 172 are connected to a ground node.

However, in one embodiment of the invention, the group of reactive elements 170 comprise two inductors 175 connected to a ground node and two capacitors 171 and 172, wherein the two capacitors 171 and 172 are connected to a ground node.

A first reactive element 171 out of the at least two reactive elements of the same kind 171, 172 may according to one embodiment be connected to the output terminal 114 of the first switching unit 110 and to a ground node. The second reactive element 172 out of the at least two reactive elements of the same kind 171, 172 may accordingly be connected to the output terminal 124 of the second switching unit 120 and to a ground node.

The capacitors 171 and 172 may in one embodiment involve the parasitic capacitance in the switching units 110 and 120. Thus the efficiency of the amplifying device 100 may be improved.

Figure 2:
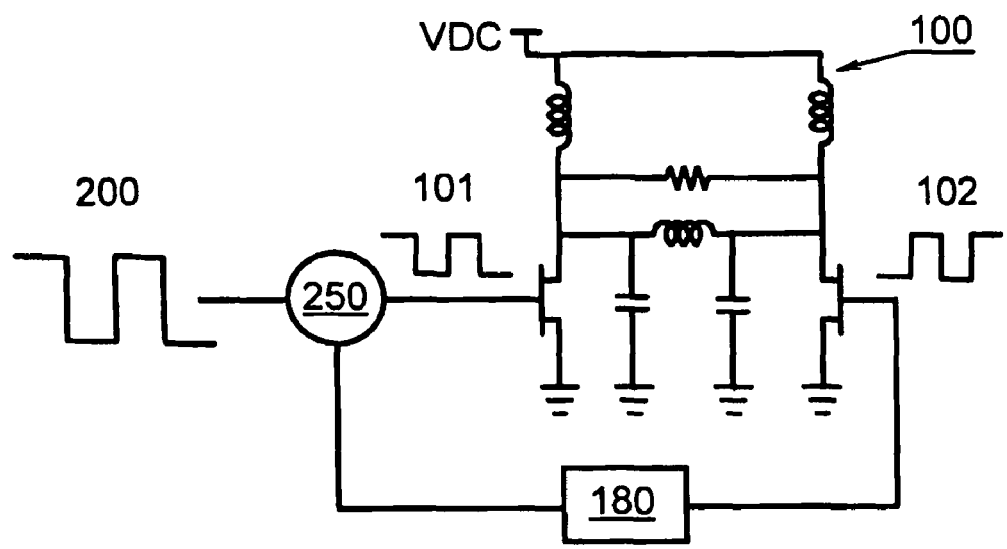
FIG. 2 is a schematic illustration over an amplifying device according to the present invention; which in particular demonstrates a phase shifting unit and a signal splitting unit.

The shift in phase between a first half 101 of an input signal 200 and a second half 102 of an input signal 200 may in one embodiment of the present amplifying device 100 be made by a phase shifting unit 180, as depicted in FIG. 2. There exist however a plurality of methods used both in digital and analogue technology, which are all known to the person skilled in the art, of shifting phase, e.g. by delaying one half 101; 102 of the signal 200.

The input signal 200 may be splitted into a first half 101 of the input signal 200 and a second half 102 of the input signal 200 by a signal splitting unit 250. The signal splitting unit 250 may comprise a signal splitting circuitry that is configured to split a signal a predetermined number of times and to generate a plurality of signal streams.

The shift in phase between the first half 101 of the input signal 200 and the second half 102 of the input signal 200 may in one embodiment be made by means of a phase shifting unit 180. The phase shifting unit 180 may be realised by means of e.g. a transmission line, a phase shift circuit etc.

Figure 3:
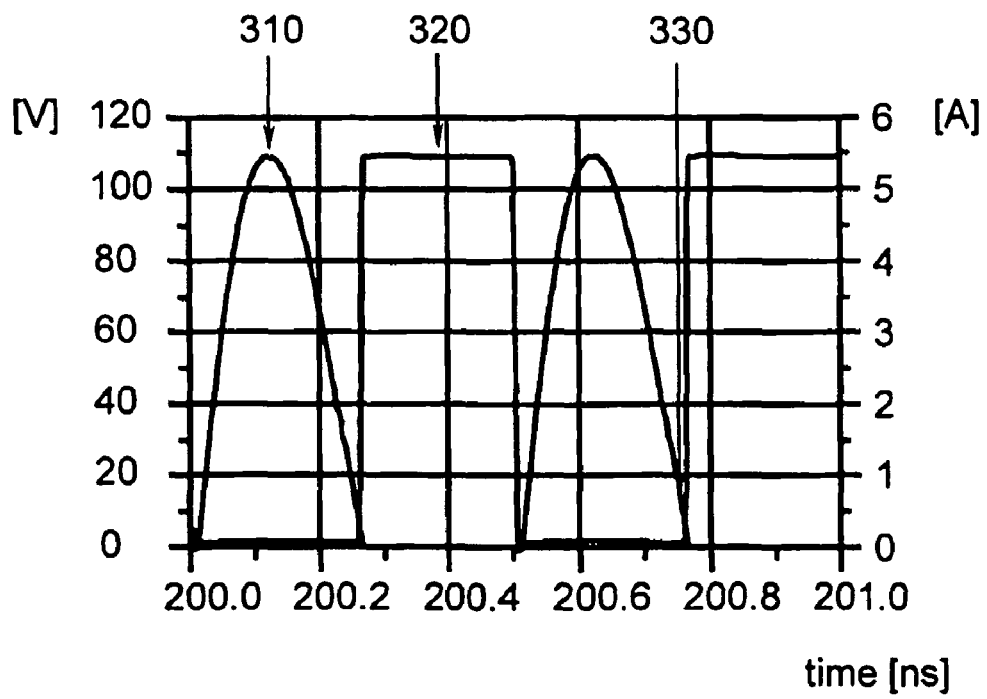
FIG. 3 is a diagram illustrating currents and voltage in an amplifying device according to the invention.

FIG. 3 illustrates currents 320 and voltage 310 over the switching units 110 and 120 in the present amplifying device 100. It is important in order to minimize efficiency loss in the switching units 110 and 120, that there is no overlap 330 between current 320 and voltage 310, as in electrical systems, power (P) is equal to the voltage (U) multiplied by the current (I):

$$P = I \cdot U$$

Thus the power loss made in the switching units 110 and 120 may be minimized, in theory even eliminated to zero, provided the overlap 330 between the components current 320 and voltage 310 is minimized or preferably eliminated. The ideal condition is to completely eliminate the overlap 330 in order to minimize efficiency loss.

Figure 4A:
FIG. 4A is a graph illustrating dissipated power in switching units and output power in a pulse width modulated current mode class D amplifier.

FIG. 4A is a graph illustrating dissipated power in switching units and output power in a pulse width modulated current mode class D amplifier 50 according to existing technology. It can be noted that the power is moved from the load 140 to the switching units 110 and 120 when the duty cycle is decreased.

Figure 4B:
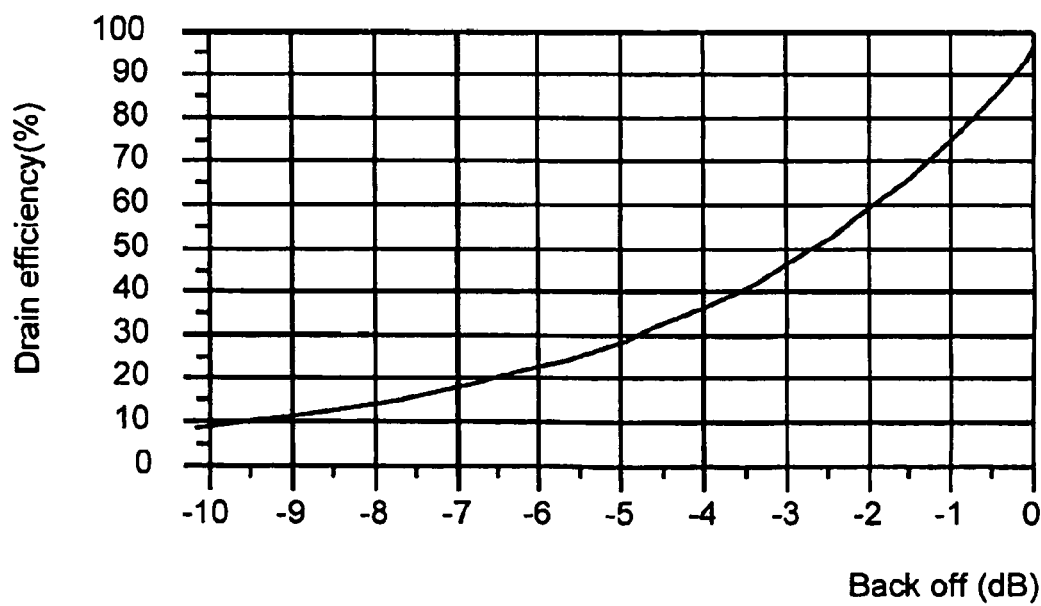
FIG. 4B is a graph illustrating drain efficiency of a pulse width modulated current mode class D amplifier versus output power back off.

FIG. 4B is a graph illustrating drain efficiency of a pulse width modulated current mode class D amplifier 50 according to existing technology, versus output power back off. It can be noted that the efficiency in back off is decreased rapidly with increased back off.

Figure 5A:
FIG. 5A is a graph illustrating dissipated power in switching units and output power in an amplifying device according to the present invention.

FIG. 5A is a graph illustrating dissipated power in the switching units 110 and 120 and output power in an amplifying device 100 according to the present invention. Note that the dissipated power in the switching units 110 and 120 is almost constant and low compared to the output power, almost independent of the output power in the amplifying device 100.

Figure 5B:
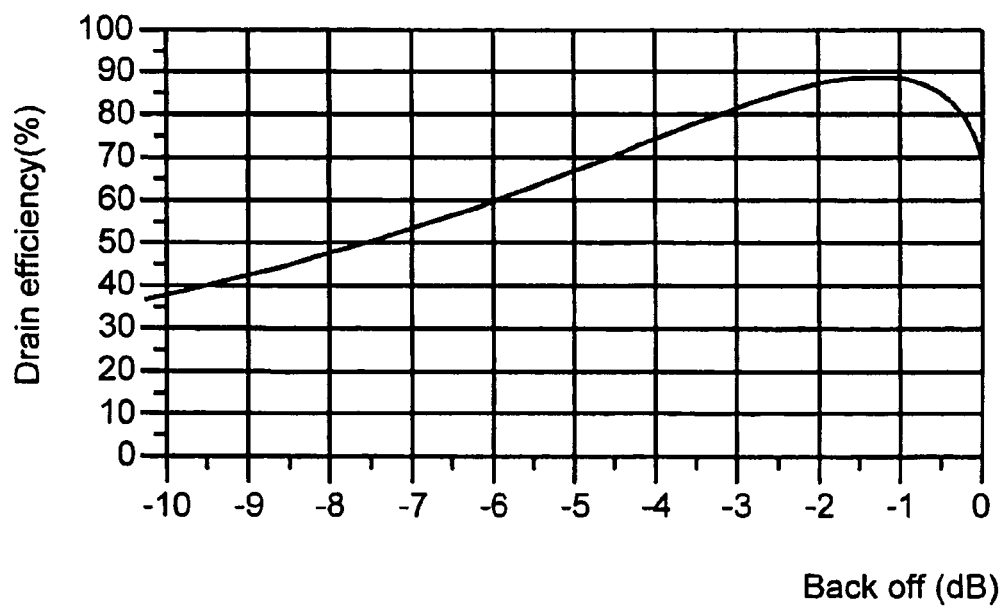
FIG. 5B is a graph illustrating drain efficiency of an amplifying device according to the present invention versus output power back off.

FIG. 5B is a graph illustrating drain efficiency of an amplifying device according to the present invention versus output power back off. With symmetrical pulses, backed off efficiency is improved compared to existing technology amplifiers 50. The dissipated power in the switching units 110 and 120, is decreasing with power, and remains at a low level in back off. Simulations indicates an increase in efficiency from 18% to 54% in 7 dB back off with symmetrical pulse width modulation in accordance with the invention.

The present invention relates to an amplifying device 100 that can be used advantageously for wireless communication in different communication situations in wireless networks.

The amplifying device 100 as herein described may be provided e.g. in a wireless access point 430, such as e.g. a base station, a wireless communications station, a fixed station, a control station, a repeater or a similar arrangement for communication.

Figure 6:
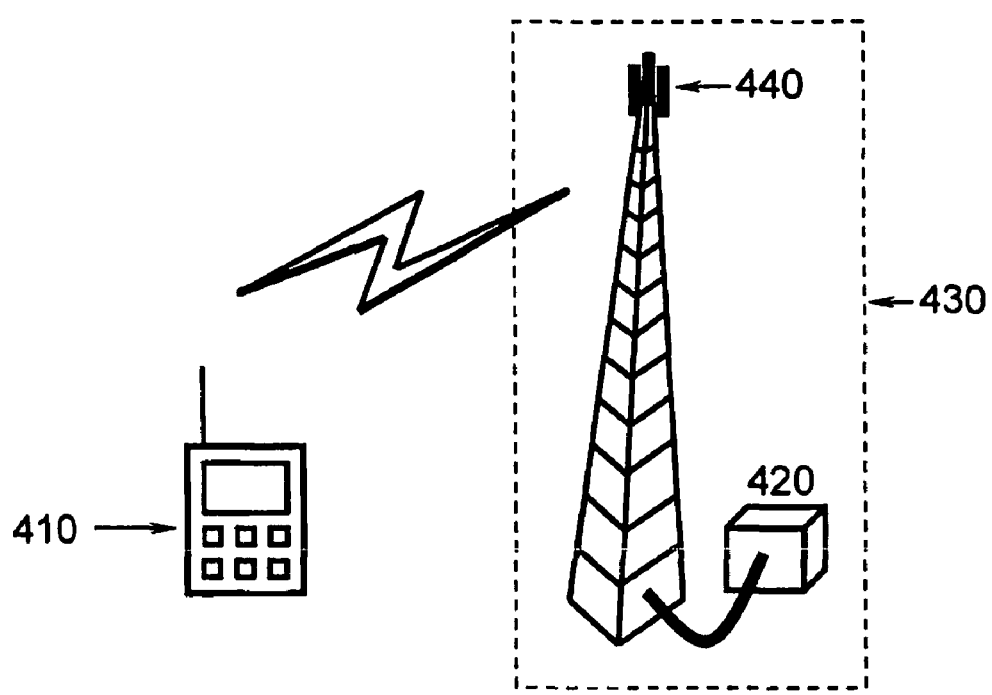
FIG. 6 is depicting a wireless transceiver comprising at least one amplifying device and a radio transmission device comprising at least one amplifying device.
Figure 7:
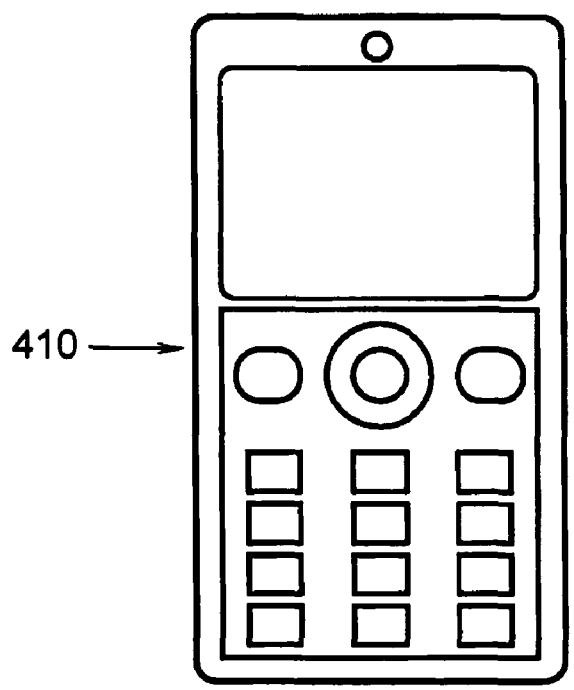
FIG. 7 is a illustrating a mobile device comprising at least one amplifying device.

FIG. 6 schematically shows one such base station 430 that includes a wireless transceiver 420 including the amplifying device 100 according to the present invention. The wireless transceiver 420 is in turn connected to an antenna 440 for communicating with a wireless terminal 410 in a communication network. The wireless terminal 410 may be a cellular phone, which is illustrated in FIG. 7.

The amplifying device 100 as herein described may however also be provided e.g. in a wireless terminal 410, like a Personal Digital Assistant (PDA), a laptop, a computer or any other kind of device adapted to communicate.

The amplifying device 100 as herein described may however alternatively be provided in an arbitrary electronic device wherein there is a need of amplification of signals, such as a hearing aid, wireless speakers, notebook computers, walkie-talkies, hunting radios, baby monitors etc.

An advantage of the present device 100 may be that it provides an amplifier which is uncomplicated to implement and easy to simulate.

While the amplifying device 100 described in this document is susceptible to various modifications and alternative forms, specific embodiments thereof are shown by way of example in the drawings and are herein described in detail. It should be understood, however, that there is no intent to limit the present device 100 to the particular forms disclosed, but on the contrary, the present device is to cover all modifications, equivalents, and alternatives falling within the spirit and scope of the amplifying device 100 as defined by the claims.

Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present.

Furthermore, "connected" or "coupled" as used herein may include wirelessly connected or coupled. As used herein, the term "and/or" includes any and all combinations of one or more of the associated listed items.

Unless otherwise defined, all terms including technical and scientific terms used herein have the same meaning as commonly understood by one of ordinary skill in the art to which these methods and arrangements belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the described embodiments, for the sole purpose of illustration, the input and output impedances are provided as inductors. It should be realised that they may as well be provided as resistors instead. The switching units 110 and 120 in the described embodiments of the amplifying device 100 are for purpose of illustration described as transistors. It should be realised that they may be any type of transistor or switches, as previously discussed. Therefore it should also be realised that the terms input terminal and output terminal are here intended to cover equivalent terms, such as gate, source and drain or base, emitter and collector.

In the described embodiments, the switching units 110 and 120 have been provided as N-type transistors, but it present no problem for the person skilled in the art to convert the design to use P-type transistors instead.

The invention claimed is:

1. An amplifying device arranged to receive an input signal having a certain duty cycle, said amplifying device comprising:
    a first switching unit having an input terminal adapted to receive a first half of the input signal, and an output terminal adapted to be connected to a first signal output where a first half of an output signal is provided,
    a second switching unit having an input terminal adapted to receive a second half of the input signal and an output terminal adapted to be connected to a second signal output where a second half of the output signal is provided, the amplifying device being characterized by:
    the first switching unit and the second switching unit being adapted to receive an input signal, wherein the first half of said input signal has the same duty cycle as the second half of the input signal but shifted in phase, and
    said amplifying device further comprises:
    a first reactive element having a first terminal and a second terminal, wherein the first terminal of the first reactive element is directly connected to the output terminal of the first switching unit and the second terminal of the first reactive element is directly connected to the output terminal of the second switching unit.

2. The amplifying device according to claim 1, wherein the input signal is split into a first half of the input signal and a second half of the input signal by a signal splitting unit.

3. The amplifying device according to claim 1, wherein the first half of the input signal has the same duty cycle as the second half of the input signal but shifted in phase by a phase shifting unit.

4. The amplifying device according to claim 1, wherein the input signal is a symmetric input signal, such that the first half of said input signal has the same duty cycle as the second half of the input signal but shifted 180 degrees in phase.

5. The amplifying device according to claim 1, wherein the amplifying device further comprises:
    a second reactive element having a first terminal and a second terminal, wherein the first terminal of the second reactive element is directly connected to the output terminal of the first switching unit; and
    a third reactive element having a first terminal and a second terminal, wherein the first terminal of the third reactive element is directly connected to the output terminal of the second switching unit.

6. The amplifying device according to claim 5, wherein the second terminal of the second reactive element is connected to a ground node, the second terminal of the third reactive element is connected to the ground node, and the first reactive element is a capacitor and the second reactive element is a capacitor.

7. The amplifying device according to claim 6, wherein the first reactive element is an inductor.

8. The amplifying device according to claim 1, wherein the switching units are provided in the form of biased conducted switching units.

9. The amplifying device according to claim 1, wherein the switching units are provided in the form of MOSFET transistors.

10. A wireless transceiver comprising at least one amplifying device according to claim 1.

11. A radio transmission device comprising at least one amplifying device according to claim 1.

12. A radio transmission device according to claim 11, wherein the radio transmission device is a wireless access point.

13. A radio transmission device according to claim 11, wherein the radio transmission device is a wireless terminal.

* * * * *